(12) United States Patent
Raciti et al.

(10) Patent No.: US 8,098,470 B2
(45) Date of Patent: Jan. 17, 2012

(54) PROTECTION UNIT FOR AN AC/DC LOW-VOLTAGE POWER SUPPLY LINE

(75) Inventors: Luca Raciti, Bergamo (IT); Luca Lanzoni, Bergamo (IT)

(73) Assignee: ABB S.p.A., Milan (IT)

(*) Notice: Subject to any disclaimer, the term of this patent is extended or adjusted under 35 U.S.C. 154(b) by 821 days.

(21) Appl. No.: 12/159,355

(22) PCT Filed: Dec. 1, 2006

(86) PCT No.: PCT/EP2006/069223
§ 371 (c)(1),
(2), (4) Date: Jun. 26, 2008

(87) PCT Pub. No.: WO2007/074023
PCT Pub. Date: Jul. 5, 2007

(65) Prior Publication Data
US 2008/0291595 A1    Nov. 27, 2008

(30) Foreign Application Priority Data
Dec. 29, 2005  (IT) .............................. MI2005A2522

(51) Int. Cl.
*H02H 7/00* (2006.01)
(52) U.S. Cl. ...................................... 361/93.7

(58) Field of Classification Search ................. 361/93.7
See application file for complete search history.

(56) References Cited

U.S. PATENT DOCUMENTS 4,179,646 A * 12/1979 Russell ........................ 318/380

FOREIGN PATENT DOCUMENTS

| DE | 3342326 | 5/1985 |
|---|---|---|
| EP | 0167884 | 1/1986 |
| EP | 1359655 | 11/2003 |
| WO | WO-2004082091 | 9/2004 |

* cited by examiner

*Primary Examiner* — Stephen W Jackson
(74) *Attorney, Agent, or Firm* — Connolly Bove Lodge & Hutz LLP

(57) ABSTRACT

Protection unit for an AC or DC low-voltage power supply line, comprising means for detecting the current circulating in one or more power supply line conductor(s) and at least first electronic protection means operatively coupled to a circuit breaker with at least one pole for inserting along said conductor, characterized in that said detection means comprise at least one resistor suitable for electrical connection in series with said circuit breaker pole and for enabling the passage of the current circulating in said conductor, and at least a first electronic processing circuit that receives a signal indicative of the voltage at the terminals of said resistor and delivers to said first electronic protection means a signal that is indicative of the current circulating in said line conductor.

20 Claims, 5 Drawing Sheets

PROTECTION UNIT FOR AN AC/DC LOW-VOLTAGE POWER SUPPLY LINE

This application is a national phase of PCT/EP2006/069223, filed on Dec. 1, 2006, which in turn claims priority from Italian application MI2005A002522, filed Dec. 29, 2005, the entire contents of all are hereby incorporated by reference.

The present invention relates to a protection unit for a direct current (DC) or alternating current (AC) low-voltage power supply line.

Ample use is made in low-voltage power systems of protection devices that are required to monitor the proper operation of the power lines and cut off the current flow in the event of anomalous operating conditions so as to avoid the lines themselves or the loads and utilities connected thereto being damaged.

For this purpose, such devices use suitable systems for recording the values of the current circulating in the line they are protecting and refer them to a suitable protection device—typically a relay—which trips a circuit breaker whenever the current value is higher than a preset threshold; the circuit breaker thus interrupts the current flow in the line.

There are various solutions currently available on the market but, though in many cases their performance is more than adequate and they ensure good results, they nonetheless present certain drawbacks, particularly as concerns the means for detecting the current circulating in the line.

To date, various types of current detector have been used, for lines in both alternating current (AC) and direct current (DC), based on different operating principles.

For instance, a first type of current detector device relies on Hall effect sensors, while other solutions are based on the use of magnetic sensors, whose magnetic cores are powered at a carrier frequency in order to exploit the magnetic characteristics of the core, and particularly of the hysteresis cycle of the material it is made of.

Being strongly susceptible to outside magnetic fields, the solutions based on Hall effect sensors require complex shielding systems, which are costly and take up space, making them scarcely suitable for use in economical, compact products. It is also important to emphasize that such shielding is usually ineffectual in the case of DC applications, consequently further restricting their practical use. Moreover, these solutions pose problems due to their relatively high consumption in operation and the limited dynamics of their measurements.

Because of their intrinsic structural characteristics, and particularly to the necessary presence of a magnetic core whose volume depends on the value of the currents being measured, solutions based on the use of magnetic sensors are mainly suitable for modest current values, typically ranging from fractions of an ampere up to a few dozen amperes, such as those required, for instance, in certain types of precision ammeter, or in residual current ($I_A$) protection devices, where small size magnetic cores suffice.

The solutions based on magnetic sensors also usually feature the use of a large number of components. Just such an example is described in the U.S. Pat. No. 4,276,510, wherein provision is made for two windings on the core, and this may introduce technical drawbacks, such as unwanted "magnetic memory" phenomena, which occur for instance after a current peak in one of the conductors being measured.

The main technical aim of the present invention is to realize a protection unit for a low-voltage power supply line that enables the above-mentioned drawbacks to be overcome, and that, by comparison with the known solutions, particularly assures a high accuracy over a wide range of electrical current recordings, e.g. from a few amperes to dozens of kA, and that is equally suitable for use in DC or AC applications.

Within said technical aim, one object of the present invention is to realize a protection unit for a low-voltage power supply line that is substantially immune to external magnetic fields and magnetic memory phenomena.

Another object of the present invention is to realize a protection unit for a low-voltage power supply line that can function with a very low energy consumption, and does not introduce any significant disturbances in the signals or in the power network, not even if it is powered directly by the line being monitored.

A further object of the present invention is to realize a protection unit for a low-voltage power supply line that can be made using an extremely limited number of components and has limited overall dimensions.

Another object of the present invention is to realize a protection unit for a low-voltage power supply line that is highly reliable and relatively easy to manufacture at competitive costs.

The aforesaid technical aim and objects, as well as others that will become apparent later on, are achieved by means of a protection unit for an AC/DC low-voltage power supply line according to the content of the claims stated herein.

Further characteristics and advantages of the invention will emerge from the description of preferred, but not exclusive, embodiments of the protection unit according to the invention, as illustrated in the non-restrictive examples in the attached drawings, wherein.

Figure 6:
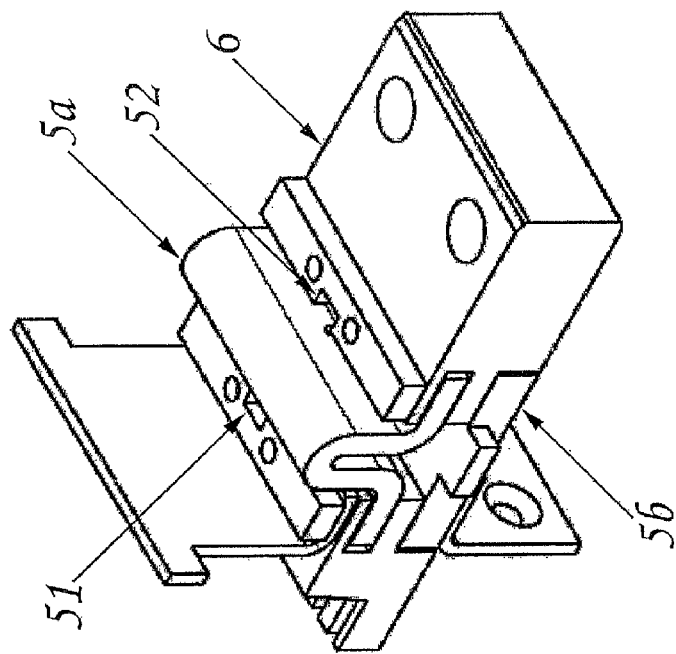
Figure 5:
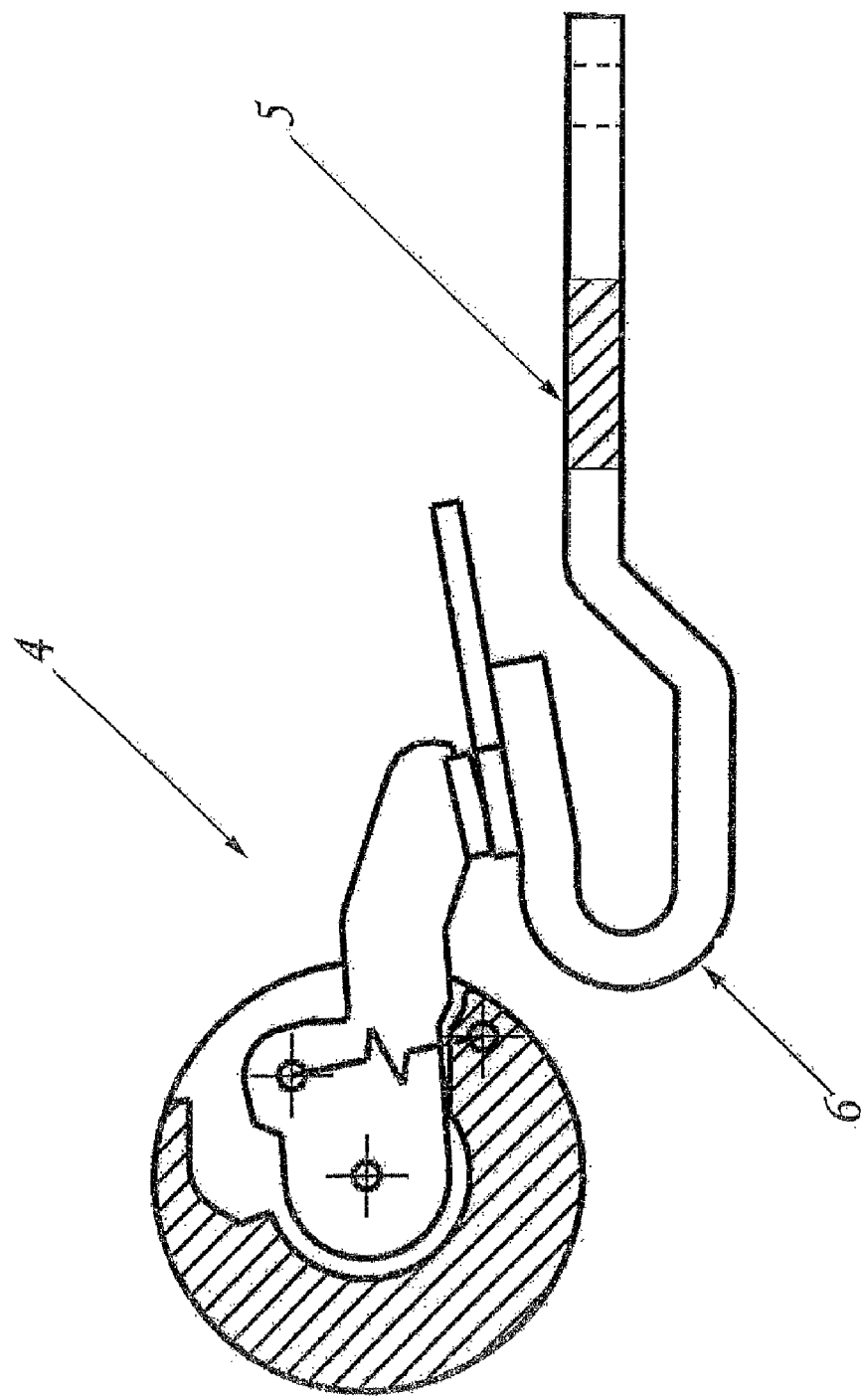

FIG. 5 partially shows a pole of an automatic low-voltage circuit breaker;

FIG. 6 is a perspective view showing an electrode of a circuit breaker pole coupled to a resistor of the protection unit according to the invention.

Figure 1:
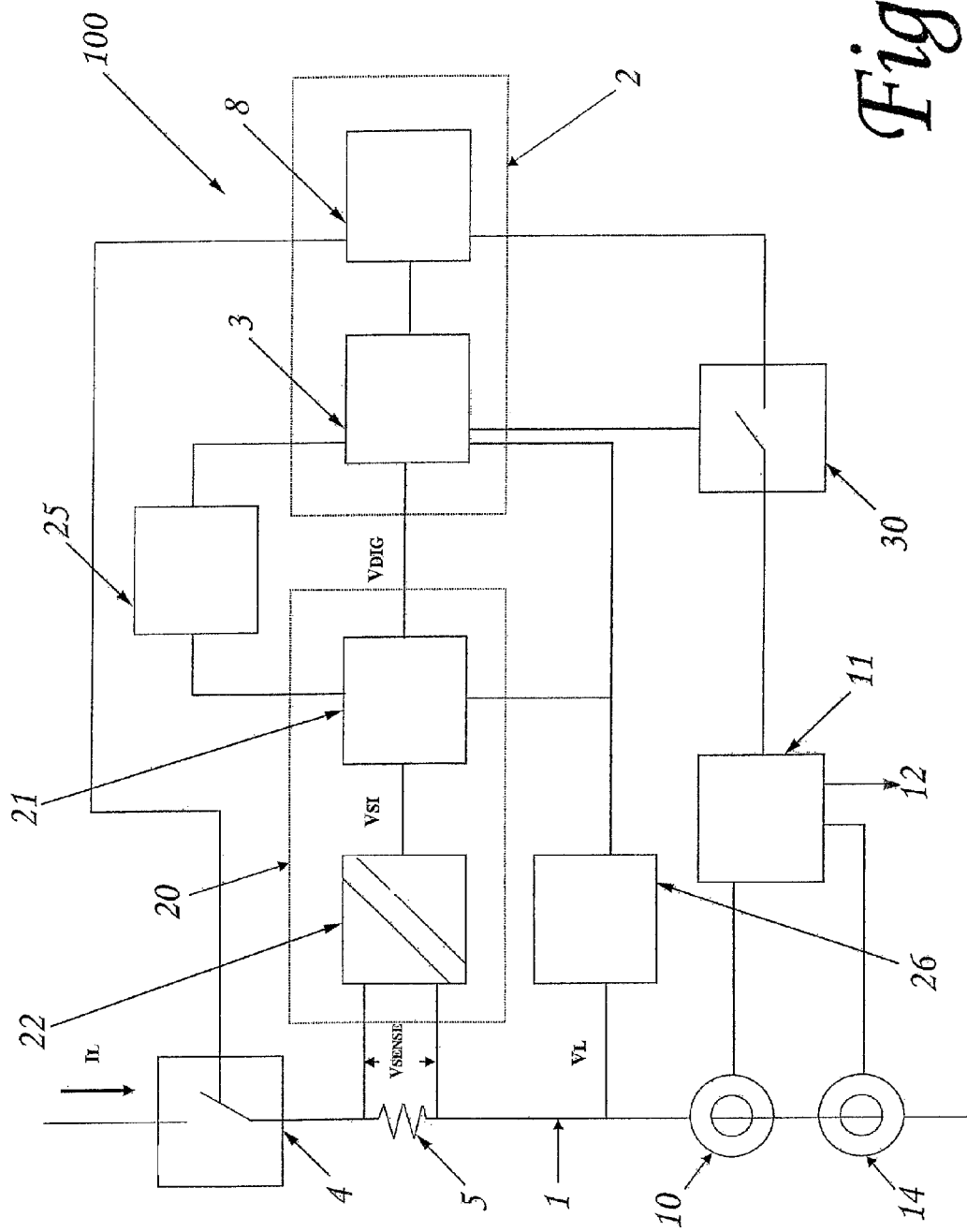
FIG. 1 is a block diagram showing a possible embodiment of the protection unit according to the invention.

FIG. 1 schematically shows the protection unit according to the invention, indicated globally by the reference number 100, which comprises means for detecting the current ($I_L$) circulating in one or more power supply line conductor(s) 1, and at least first electronic protection means 2; said protection means 2 comprise a processing unit 3, which consists—according to well-known embodiments—of a microcontroller or microprocessor, or a DSP (Digital Signal Processor) with releasing means 8, such as a trip coil; in operating conditions, the electronic means 2 are operatively coupled to a circuit breaker with at least one pole, illustrated schematically in FIGS. 1 and 5 by the reference numeral 4, for insertion on the conductor 1. The protection means 2 preferably consist of an electronic relay, such as a protection or trip unit, or form a part thereof.

Figure 2:
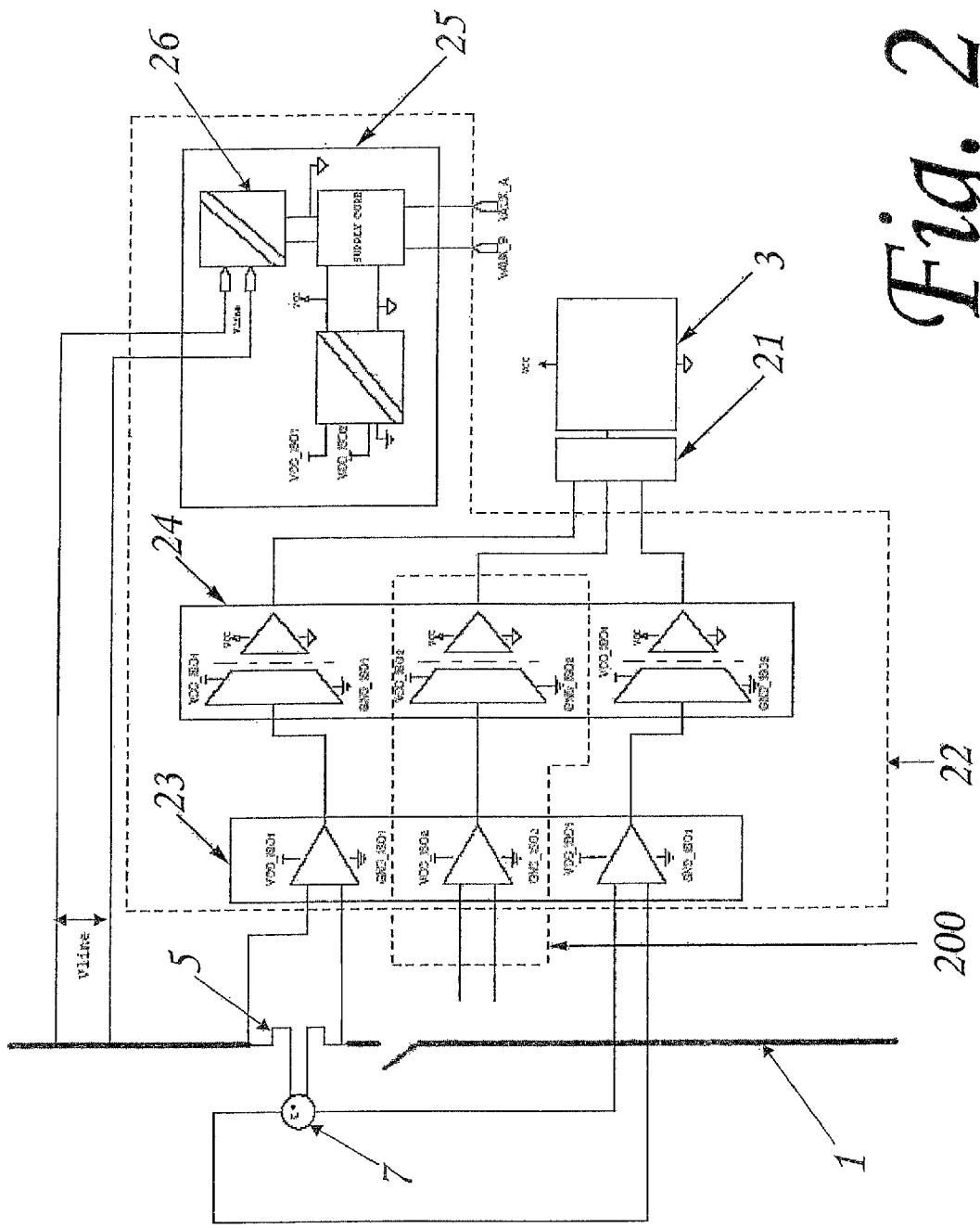
FIG. 2 is a block diagram showing a possible embodiment of the circuit for some of the components in the protection unit of FIG. 1.
Figure 3:
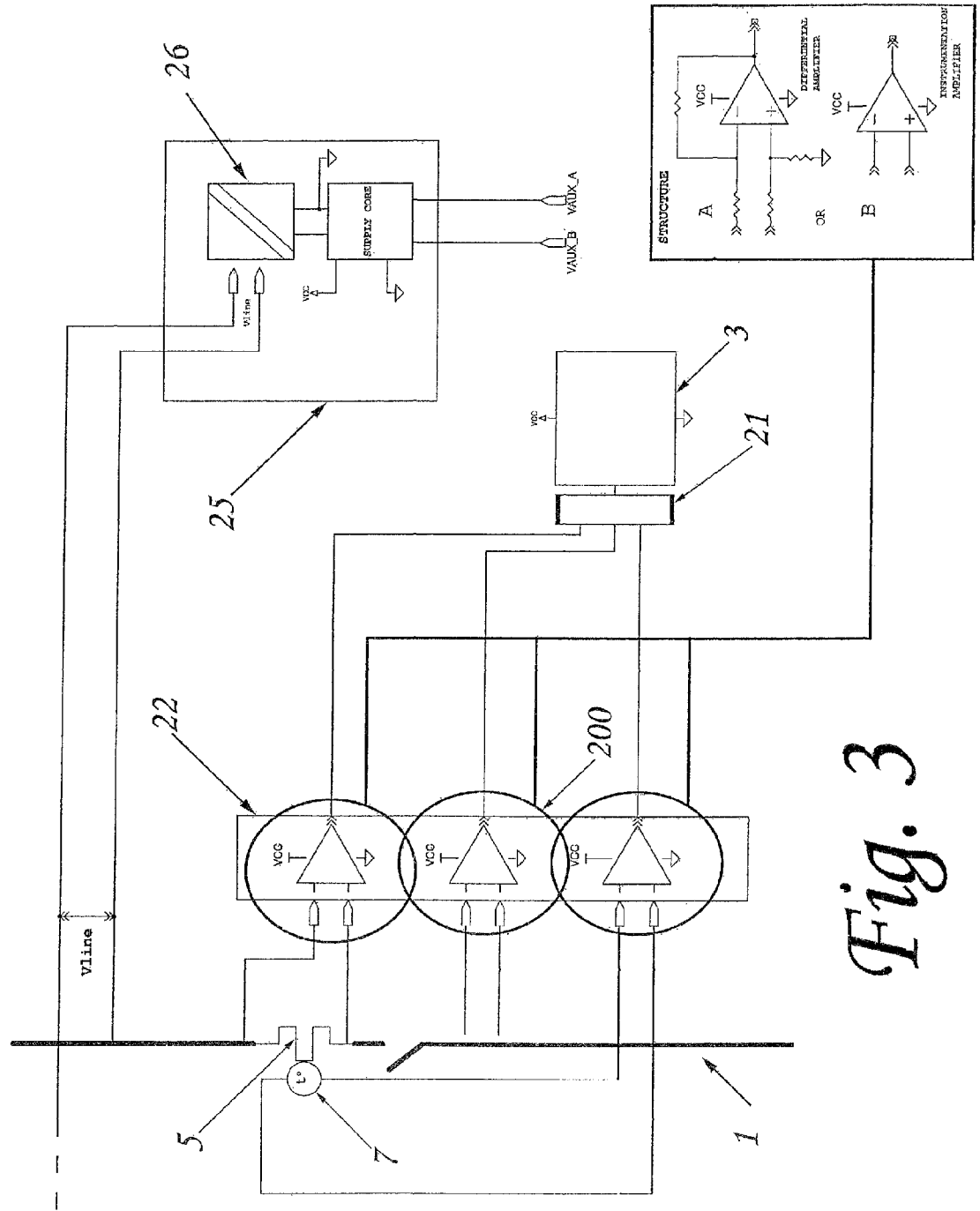
FIG. 3 is a block diagram showing a further embodiment of the circuit for some of the components of the protection unit of FIG. 1.

To facilitate the description, FIG. 1 shows only a single power supply line conductor 1, through which a line current ($I_L$) passes, while the description that follows is clearly applicable in exactly the same manner to any number of power supply line conductors and corresponding circuit breaking poles. For instance, the circuit in FIGS. 2 and 3 schematically illustrates the presence of circuit components 200 for associating with a further pole, where applicable.

In the protection unit 100 according to the present invention, the detection means advantageously comprise at least one resistor 5 for connecting electrically in series to the pole 4 of the circuit breaker and for carrying the current $I_L$ circulating in the conductor 1, and at least one first electronic processing circuit, globally indicated in FIG. 1 by the reference numeral 20, that receives as input a signal indicative of the voltage ($V_{SENSE}$) at the terminals of the resistor 5 and that, after suitable processing, delivers a corresponding signal to the first electronic prediction means 2 that is indicative of the current $I_L$ circulating in said power supply line conductor 1.

According to a structurally straightforward but nonetheless functionally effective embodiment, the resistor 5 comprises at least one stretch of electric conductor with an electrical resistance ($R_{SENSE}$) of a previously-established value coming between two pre-set reference points, e.g. between its two terminals. For instance, the resistor 5 may be in the form of a length of copper bar suitably loaded with controlled proportions of other chemical elements, such as Ni 6%. Said resistor 5 may be installed directly inside the body of the circuit breaker or on the outside thereof.

According to a preferred embodiment, the resistor 5 comprises at least one stretch of conductor lying along an electrode 6 of the pole 4 of the circuit breaker, either inside the body of the circuit breaker, as schematically illustrated in FIG. 5, or on its outside. To be more precise, in both circumstances, the resistor 5 of pre-established resistance may consist directly of at least a part of the electrode 6, as illustrated schematically in FIG. 5, e.g. by means of a suitable shaping of at least one stretch of the electrode 6 and/or by means of an appropriate choice of structural materials for the whole or a part of said electrode. Alternatively, the resistor 5 may be obtained by physically placing an additional conductor along the body of the electrode 6, in which case said additional conductor representing the resistor 5 may comprise either a single piece or two or more separate pieces. Such an example is schematically illustrated in FIG. 6, wherein the resistor 5 comprises two separate conductor elements 5a and 5b of known resistance situated in parallel with one another so that together they constitute a resistor 5 in series on the electrode 6. At the terminals of the resistor 5 there are suitable contacts 51 and 52 from which the voltage $V_{SENSE}$ is obtained. Using this solution affords a suitable flexibility in application because the two pieces 5a and 5b can be suitably "modulated", e.g. by changing their shape and/or size and/or composition, to obtain various solutions. In some circumstances, moreover, one or both the pieces 5a and 5b can also, or mainly (only one in this latter case) have a mechanical function, such as to support further elements, for centering purposes, etc.

Preferably, as illustrated in FIG. 2 as 3, the current detection means comprise at least one temperature sensor 7, e.g. one or more thermocouples operatively associated with the resistor 5 and with the first processing circuit 20 so as to deliver a signal to the electronic protection device 2 that is indicative of the working temperature of the resistor 5, according to embodiments and for purposes that will be further explained later on.

The first electronic processing circuit 20 comprises an analog-to-digital (A/D) converter circuit 21 and a circuit safeguard (or protection) device 22, of the so-called "surge protector" type, for instance. In the embodiment shown in FIG. 2, the safeguard device 22 is obtained by means of an isolating or galvanic uncoupling circuit comprising a first electronic stage 23 for conditioning the input signal indicative of the voltage at the terminals of the resistor 5. In particular, said conditioning stage 23 can amplify or attenuate the signal or dynamics; in the embodiment illustrated in FIG. 2, it has an amplifying function. Moreover, the safeguard device 22 comprises a second isolating stage 24, which sends to the A/D converter 21 a signal that is isolated, i.e. it has no galvanic continuity, or no uninterrupted stretches of conductor material. Alternatively, the conditioning 23 and isolating 24 stages may be inverted with respect to one another, i.e. the signal is first isolated and then conditioned (i.e. amplified in the embodiment in FIG. 2), without affecting the general functionalities of the device.

According to the embodiment illustrated in FIG. 3, the safeguard device 22 comprises a high-impedance circuit that simulates a galvanic uncoupling and comprises a single processing stage, which receives an input signal indicative of the voltage at the terminals of the resistor 5 and delivers to the converter 21 a corresponding signal after its conditioning (here again, the amplification function is illustrated in the example) and high-impedance uncoupling.

As shown in the figures, the safeguard device 22 is advantageously placed downstream from the resistor 5, between the latter and the A/D converter 21. This creates an isolating barrier upstream from the A/D converter, which enables the circuit processing part to be isolated from the mains power network or main circuit, and consequently makes said circuit processing part virtually invulnerable to any peaks in the current, or especially in the voltage, which are typical of the applications for which the protection unit 100 is conceived.

In the unit 100 according to the invention, at least the first electronic protection means 2, and particularly the microprocessor unit 3 and the A/D converter 21 are advantageously powered from the same power source, indicated in the figures by the reference numeral 25; it is preferable for the unit 22 to be powered from the same power source too. As schematically illustrated in FIGS. 2 and 3, the A/D converter 21, the microprocessor unit 3 and the safeguard device 22, if any, can be powered from one or more of the following sources:

a galvanically isolated auxiliary power supply unit with a voltage ($V_{AUX}$);

a power supply from the line voltages ($V_L$) via a network power source schematically illustrated in FIG. 1 with the reference numeral 26. In this case, the power supply unit 26 provides an isolated power supply as well as analog signals, where applicable, for measuring the line voltages and, as in the case of the current signals, for processing by the microcontroller unit 3 after their acquisition by the A/D converter 21. Based on the digital signals acquired, the processing unit 3 can thus have voltage, power and energy measurements available as well as current measurements, where this functionality is required.

Figure 4:
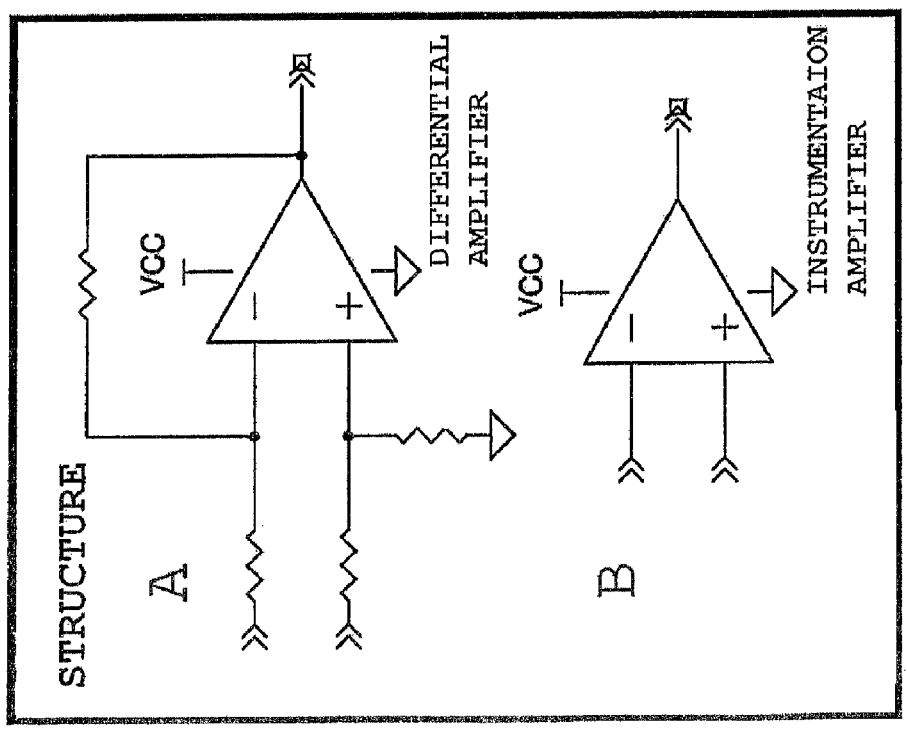
FIG. 4 shows two embodiments of the circuit of FIG. 3.

In operating conditions, the current $I_L$ circulating in the conductor 1 flows through the resistor 5 and the pole 4; a voltage drop ($V_{SENSE}$) is generated at the end of the resistor 5 that is substantially proportional to the current $I_L$. The signal $V_{SENSE}$ becomes the input to the first processing circuit 20, where it is first isolated/uncoupled and then conditioned in the safeguard device 22. To be more precise, the safeguard device 22 can be implemented in two ways, as explained previously: in the embodiment shown in FIG. 2, the signal is initially conditioned (i.e. amplified in the situation illustrated) and then isolated—or, vice versa, first isolated and then conditioned—using isolated operational amplifiers and galvanically isolated power sources (VDC_ISO, GND_ISO isolated from Vdc and GND) for the two sections of said amplifiers; on the other hand, in the embodiment illustrated in FIG. 3 the signal coming from the resistor 5 is conditioned (in the example illustrated it is amplified) and uncoupled by means of a high-impedance stage, which can be implemented using differential amplifiers with a high input impedance, as shown in FIG. 4 section A, or by means of instrumentation amplifiers, as shown in FIG. 4 section B. The conditioned and isolated/uncoupled voltage signal $V_{SI}$ (whose value is proportional to $V_{SENSE}$) is then converted in the A/D converter 21 and is finally acquired in the form of a digital data flow ($V_{DIG}$) by the processing unit 3, which takes the measurement and operates the circuit breaker actuator 8 in the event of the operating conditions being monitored requiring the circuit breaker's intervention.

The processing unit 3 also receives a signal from the temperature sensor 7, if any, and this signal is also conditioned/isolated and converted in much the same way as explained before for the signal picked up at the terminals of the resistor 5; the microprocessor unit 3 thus also performs a temperature-related compensation for the behavior of the resistor 5. As a result, the effect of any variation in the value of $R_{SENSE}$ relating to a change in temperature does not pose a problem because, providing the R-T behavior of the materials used is known in advance, a simple algorithm incorporated in the processing unit 3 can be used to make the necessary adjustments.

According to an embodiment illustrated schematically in FIG. 1, the unit 100 also comprises a current sensor 10, e.g. a current transformer (CT), operatively associated with the pole 4 of the circuit breaker, and second electronic protection means 11, preferably consisting of an electronic relay of conventional type, capable of acquiring a signal, comparing it with a threshold and, if necessary, tripping a circuit breaker. Said second protection means 11 are operatively connected to and powered by the current sensor 10.

The second electronic protection means 11 receive a signal from the current sensor 10 that is indicative of the current circulating in the conductor 1, and they compare this with a previously-established threshold value (which can be set, for instance, by means of dip switches) corresponding, for instance, to a short-circuit current condition $I_{SC}$. When said threshold is exceeded, the second protection means 11 send a corresponding signal 12 to means for tripping the circuit breaker, such as an electromagnetic release that opens the circuit breaker.

Alternatively, the detection means may comprise a first current sensor 10, such as a current transformer, operatively associated with the circuit breaker pole, that delivers to the second electronic protection means 11 only the power needed for their operation, and a second current sensor 14, e.g. a Rogowski coil, also operatively associated with the pole 4, that sends a signal to the protection means 11 that is indicative of the current circulating in the conductor 1. Here again, the protection means 11 process the signal generated by the Rogowski sensor, integrating it and comparing the result with a threshold that can be adjusted, for instance, by means of dip switches. When said threshold is exceeded, a trip command 12 is sent to means for tripping the circuit breaker.

The microprocessor unit 3 of the electronic protection means 2 is advantageously coupled operatively to the second electronic protection means 11, and configured so as to functionally override said second protection means 11 when the device 100 is operating in a steady state; said override can be achieved, for instance, by means of a switching device of known type, schematically represented in FIG. 1 by the reference number 30, to which the unit 3 sends a suitable signal.

Both embodiments thus assure an adequate protection even during the short period of time that it takes for the device 100 to reach a steady state, particularly as regards the circuit 20 and the means 2. In fact, the startup time, especially in the case of a power supply from the mains network ($V_L$), can take roughly 10 to 100 ms, so this can be particularly useful in the event of a latent short-circuit being present in the network requiring protection already in the initial stages, when the circuit breaker is switched to the ON position.

It has been demonstrated experimentally that the protection unit according to the invention fulfills the previously-stated technical aim and objects, also affording a significant number of advantages and technical and functional improvements over the know state of the art. In particular, the unit 100 has a highly dynamic measurement capacity that is translated into a high precision and a wide detection range, with a straightforward and inexpensive construction that is suitable for assuring a stable and repeatable performance, and that is particularly efficient and accurate even at high current values, for which the solutions of the known state of the art prove particularly inadequate. The unit 100 is also substantially immune to any magnetic memory phenomena thanks to the fact that the only magnetic component involved, if any—i.e. the current sensor 10, functions only for extremely limited periods of time.

A far from negligible feature lies in the fact that the specific solution involving the resistor 5 being installed inside the body of the circuit breaker, and particularly in the case of this consisting of a length of an electrode of the pole 4, is extremely advantageous from the point of view of the overall dimensions of the device, given the usually cramped spaces available inside the body of circuit breakers. On the other hand, the solution involving the resistor 5 being on the outside of the circuit breaker is particularly suitable and advantageous when fitting traditional types of circuit breaker (that have not been specifically predisposed for this purpose) with the innovative functionalities of the unit 100, and especially of the electronic relay 2.

Moreover, the fact that the whole system is isolated from the primary power supply line and/or auxiliary power source enables safe operation and successful completion of the dielectric tests specified for automatic circuit breakers by the reference standards without having to remove the electronic circuits. In addition, thanks to its optimized energy absorption characterized by an extremely limited consumption, the unit 100 thus realized is also suitable for installation in systems where the energy available is limited, or where the user wishes to avoid interfering appreciably with the general energy balance, and the unit can operate even at extremely limited values of the voltage $V_{SENSE}$, and consequently of the resistance of the resistor $R_{SENSE}$. For example, the sample resistance $R_{SENSE}$ may have a resistance value coming roughly between 8 and 30 $\mu\Omega$, thus preventing any significant interference with the electrical conditions of the system and inducing no significant heating phenomena in the circuit breaker. For instance, where $R_{SENSE}=30$ $\mu\Omega$ and $I_L=600$ A, there is a dissipation $P_R=R_{SENSE}*I_L*I_L=V_{SENSE}*I_L=30*10^{-6}*600*600=10.8$ W. As a result, the currents can even exceed 50 kA without posing any problems, i.e. without $V_{SENSE}$ going beyond the magnitude of a few Volts.

Finally, but certainly no less important, the unit 100 according to the invention can be used coupled either to a DC or to an AC low-voltage power line, in a variety of electrical systems, particularly in industrial applications. Thus, a further object of the present invention is a low-voltage electrical system, characterized in that it comprises a protection unit 100 as previously described and stated in the claims.

From the structural point of view, moreover, the unit 100 may be made using a set of discrete components operatively assembled together in practical applications, coupling them physically to different components, or arranging them on board a single appliance and making them into a single element, or in several separate component parts. As previously described, for instance, the resistor 5 may be contained inside the body of the circuit breaker and the electronic part may be fitted entirely on a board installed in the electronic relay, or only partially, e.g. placing the converter 21 on the relay; or it may be made all in one or more components installed on a relay that is then coupled to the circuit breakers; or again, the unit 100 may be made in one or more separate parts directly associated with the body of the circuit breaker, on the inside and/or on the outside. Thus, a further object of the present invention comprises a protection unit 100 according to the previous descriptions and claims and a circuit breaker comprising said electronic relay; a low-voltage circuit breaker comprising a protection unit 100 as previously described, preferably coupled directly with the body of said circuit breaker.

The protection unit thus conceived may undergo numerous modifications and come in several variants, all coming within the scope of the inventive concept. Moreover, all the component parts described herein may be substituted by other, technically equivalent elements. In practice, the component materials and dimensions of the device may be of any nature, according to need and the state of the art.

The invention claimed is:

1. Protection unit for the protection of an AC or DC low-voltage power supply line, comprising means for detecting the current circulating in one or more power supply line conductor(s), and at least first electronic protection means operatively coupled to a circuit breaker having at least one pole for inserting on said conductor, characterized in that said detection means comprise at least one resistor suitable for being connected electrically in series to said circuit breaker pole and enabling the passage of the current circulating in said conductor, and at least a first electronic processing circuit that receives a signal indicative of the voltage at the terminals of said resistor and that delivers a signal to said first electronic protection means that is indicative of the current circulating in said line conductor, and wherein said circuit breaker is capable of interrupting the current that is detected by the resistor in said line conductor.

2. Protection unit according to claim 1, characterized in that said resistor comprises a length of electrical conductor having a pre-defined electrical resistance.

3. Protection unit according to claim 2, characterized in that said resistor consists of a stretch of electrical conductor lying directly inside the body of the circuit breaker.

4. Protection unit according to claim 2, characterized in that said resistor consists of a length of electrical conductor coupled to the pole of the circuit breaker and installed on the outside of the circuit breaker.

5. Protection unit according to claim 1, characterized in that said resistor consists of at least a stretch of an electrode of the circuit breaker pole.

6. Protection unit according to claim 1, characterized in that said resistor consists of at least a stretch of electrical conductor coupled to and lying along an electrode of the circuit breaker pole.

7. Protection unit according to claim 1characterized in that said resistor comprises two electrical conductors in parallel to one another and together in series with said electrode.

8. Protection unit according to claim 1, characterized in that said first electronic processing circuit comprises an analog-to-digital (A/D) converter unit and a circuit safeguard device inserted between said resistor and said A/D converter.

9. Protection unit according to claim 8, characterized in that said safeguard device comprises a first electronic conditioning stage and a second isolating or galvanic uncoupling stage, said first and second stages being coupled together so as to deliver a conditioned and isolated signal to the converter unit that corresponds to the signal received and is indicative of the voltage at the terminals of the resistor, said first and second stages being arrangeable in any sequential order in relation to one another.

10. Protection unit according to claim 8, characterized in that the circuit safeguard device comprises a single high-impedance processing stage that receives said signal indicative of the voltage at of the terminals of the resistor and delivers a corresponding conditioned and uncoupled signal to said converter unit.

11. Protection unit according to claim 1, characterized in that the detection means comprise at least one temperature sensor operatively coupled to the resistor and to the first processor circuit so as to deliver a signal indicative of the working temperature of the resistor to said first electronic protection means.

12. Protection unit according to claim 1, characterized in that the first electronic protection means comprise a microprocessor unit powered from the same power source as said A/D converter.

13. Protection unit according to claim 1, characterized in that it comprises a current sensor operatively associated with said circuit breaker pole and second electronic protection means operatively connected to and powered by said current sensor, said second electronic protection means being suitable for producing a signal for tripping the opening of the circuit breaker whenever the input from said current sensor indicating the current circulating in the line conductor exceeds a preset threshold.

14. Protection unit according to claim 1, characterized in that it comprises a first current sensor operatively associated with said circuit breaker pole, second electronic protection means operatively connected to and powered by said current sensor, a second current sensor that sends to said second electronic protection means a signal indicative of the current circulating in said conductor, said second electronic protection means being suitable for producing a signal to trip the opening of the circuit breaker whenever said input signal indicative of the current circulating in the conductor exceeds a preset threshold.

15. Protection unit according to claim 1, characterized in that said microprocessor unit of the first electronic protection means is operatively coupled to said second electronic protection means so as to override the latter during operation in a steady state.

16. AC/DC low-voltage electric system characterized in that it comprises a protection unit according to claim 1.

17. Electronic relay characterized in that it comprises a protection unit according to claim 1.

18. Low-voltage circuit breaker characterized in that it comprises a protection unit according to claim 1, said protection unit being coupled directly to the body of said circuit breaker.

19. Low-voltage circuit breaker characterized in that it comprises an electronic relay according to claim 17.

20. Protection unit according to claim 2, characterized in that said resistor consists of at least a stretch of an electrode of the circuit breaker pole.

* * * * *